(12) United States Patent
Ioki et al.

(10) Patent No.: US 12,009,817 B2
(45) Date of Patent: Jun. 11, 2024

(54) FLIP-FLOP CIRCUIT, SEMICONDUCTOR INTEGRATED CIRCUIT DEVICE, AND VEHICLE

(71) Applicant: Rohm Co., Ltd., Kyoto (JP)

(72) Inventors: Kazuya Ioki, Kyoto (JP); Ryuichi Nakajima, Kyoto (JP); Kazutoshi Kobayashi, Kyoto (JP); Jun Furuta, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 17/898,690

(22) Filed: Aug. 30, 2022

(65) Prior Publication Data
US 2023/0062075 A1  Mar. 2, 2023

(30) Foreign Application Priority Data

Aug. 31, 2021 (JP) .................................. 2021141436

(51) Int. Cl.
*H03K 19/0948* (2006.01)
*H03K 3/037* (2006.01)

(52) U.S. Cl.
CPC ....... *H03K 19/0948* (2013.01); *H03K 3/0372* (2013.01)

(58) Field of Classification Search
CPC ...... H03K 3/027; H03K 3/0372; H03K 3/353; H03K 3/356; H03K 3/3562; H03K 3/35625; H03K 19/02; H03K 19/08; H03K 19/094; H03K 19/0948
See application file for complete search history.

(56) References Cited

U.S. PATENT DOCUMENTS

| | | | | |
|---|---|---|---|---|
| 5,767,716 A * | 6/1998 | Ko | .......................... | H03K 3/012 327/218 |
| 6,445,236 B1 * | 9/2002 | Bernard | ............. | H03K 3/35625 327/202 |
| 7,868,677 B2 * | 1/2011 | Jain | .................. | H03K 3/356156 327/202 |
| 8,643,421 B1 * | 2/2014 | Aipperspach | ...... | H03K 3/35625 327/202 |
| 10,411,677 B2 * | 9/2019 | Kim | ..................... | H03K 23/001 |

(Continued)

FOREIGN PATENT DOCUMENTS

JP  2017-041675  2/2017
JP  2021-61518  4/2021

OTHER PUBLICATIONS

DE OA—German Patent and Trademark Office, Office Action in German Appln. No. 102022208978.2, dated Dec. 12, 2023, 19 pages (with machine translation summary).

*Primary Examiner* — Jason M Crawford
(74) *Attorney, Agent, or Firm* — Fish & Richardson P.C.

(57) ABSTRACT

A flip-flop circuit includes master latch including a first inverter and a first tri-state inverter, wherein the first tri-state inverter includes a first NMOS transistor and a first PMOS transistor; a slave latch including a second inverter and a second tri-state inverter, wherein the second tri-state inverter includes a second PMOS transistor and a second NMOS transistor; and at least one of a first wiring configured to connect a source of the first PMOS transistor and a source of the first NMOS transistor and a second wiring configured to connect a source of the second PMOS transistor and a source of the second NMOS transistor.

7 Claims, 9 Drawing Sheets

(56) References Cited

U.S. PATENT DOCUMENTS

| | | | |
|---|---|---|---|
| 10,659,017 B1* | 5/2020 | Rengarajan | H03K 3/0372 |
| 10,890,623 B1* | 1/2021 | Huott | G01R 31/318541 |
| 11,043,937 B1* | 6/2021 | Subbannavar | H03K 3/012 |
| 11,177,807 B2* | 11/2021 | Chang | H03K 3/356008 |
| 11,277,122 B2* | 3/2022 | Kobayashi | H03K 3/35625 |
| 11,387,819 B2* | 7/2022 | Rao | H03K 3/02335 |
| 2013/0173977 A1* | 7/2013 | Gurumurthy | G01R 31/318552 |
| | | | 714/E11.155 |
| 2014/0240017 A1* | 8/2014 | Cheng | H03K 3/35625 |
| | | | 327/203 |
| 2014/0285236 A1* | 9/2014 | Cheng | H03K 19/09429 |
| | | | 326/58 |
| 2015/0070062 A1* | 3/2015 | Cabanas-Holmen | |
| | | | H03K 3/012 |
| | | | 327/199 |
| 2015/0200651 A1* | 7/2015 | Baratam | H03K 3/012 |
| | | | 327/202 |
| 2016/0094204 A1* | 3/2016 | Nandi | H03K 3/0372 |
| | | | 327/203 |
| 2016/0097811 A1* | 4/2016 | Kim | G01R 31/318541 |
| | | | 714/726 |
| 2016/0098506 A1* | 4/2016 | Agarwal | H03K 3/0375 |
| | | | 716/108 |
| 2016/0112036 A1* | 4/2016 | Goyal | H03K 3/35625 |
| | | | 327/203 |
| 2017/0063350 A1* | 3/2017 | Cheng | H03K 3/35625 |
| 2018/0019736 A1* | 1/2018 | Kim | H03K 3/356104 |
| 2019/0348972 A1* | 11/2019 | Kim | H03K 3/35625 |
| 2021/0058083 A1* | 2/2021 | Chang | H03K 19/00338 |
| 2021/0210479 A1* | 7/2021 | Kang | H01L 27/0207 |
| 2021/0226616 A1* | 7/2021 | Kobayashi | H03K 3/0375 |
| 2022/0173725 A1* | 6/2022 | Bhat | H03K 3/012 |
| 2022/0407504 A1* | 12/2022 | Kang | H03K 3/35625 |
| 2023/0062075 A1* | 3/2023 | Ioki | H03K 3/0372 |

* cited by examiner

FLIP-FLOP CIRCUIT, SEMICONDUCTOR INTEGRATED CIRCUIT DEVICE, AND VEHICLE

CROSS-REFERENCE TO RELATED APPLICATION

This application is based upon and claims the benefit of priority from Japanese Patent Application No. 2021-141436, filed on Aug. 31, 2021, the entire contents of which are incorporated herein by reference.

TECHNICAL FIELD

The present disclosure relates to a flip-flop circuit, a semiconductor integrated circuit device including the flip-flop circuit, and a vehicle.

BACKGROUND

ISO26262 has been standardized for functional safety related to automobile electric/electronic systems, and the level of reliability required for semiconductor integrated circuit devices mounted on vehicles has been increasing.

A soft error is attracting attention as a cause of lowering the reliability of flip-flop circuits included in semiconductor integrated circuit devices. The soft error occurs when radiation passes through or collides with a semiconductor integrated circuit device to generate electron-hole pairs and the holding values of memory elements are temporarily inverted.

As a countermeasure against the soft error in the flip-flop circuits, a redundant flip-flop circuit having a configuration in which the flip-flop circuits are tripled and a majority decision circuit is connected to each flip-flop circuit is generally used. In the redundant flip-flop circuit, even if output inversion occurs due to a soft error in one of three flip-flop circuits, if the remaining two hold a correct output value, a correct signal is output by the majority vote of the majority decision circuit.

However, the redundant flip-flop circuit significantly increases a circuit area, delay time, and power consumption as compared with a single flip-flop circuit. That is, the redundant flip-flop circuit has a problem that overheads of circuit area, delay time, and power consumption are large.

A conventional flip-flop circuit improves soft error resistance by generating output data of the flip-flop circuit by a majority decision based on output data from a master latch circuit and two output data from two slave latch circuits. The flip-flop circuit can suppress the overheads of circuit area, delay time, and power consumption as compared with the above-described redundant flip-flop circuit. However, the flip-flop circuit has room for improvement in terms of overhead suppression of circuit area, delay time, and power consumption. Further, the flip-flop circuit can detect and correct soft errors only in a clock stop state.

SUMMARY

According to one embodiment of the present disclosure, a flip-flop circuit includes: a master latch including a first inverter and a first tri-state inverter configured such that an input terminal of the first tri-state inverter is connected to an output terminal of the first inverter and an output terminal of the first tri-state inverter is connected to an input terminal of the first inverter, wherein the first tri-state inverter includes a first NMOS transistor configured such that a clock signal is input to a gate of the first NMOS transistor, and a first PMOS transistor configured such that an inverted clock signal, which is an inversion of the clock signal, is input to the first PMOS transistor; a slave latch including a second inverter and a second ti-state inverter configured such that an input terminal of the second tri-state inverter is connected to an output terminal of the second inverter and an output terminal of the second tri-state inverter is connected to an input terminal of the second inverter, wherein the second tri-state inverter includes a second PMOS transistor configured such that the clock signal is input to a gate of the second PMOS transistor, and a second NMOS transistor configured such that the inverted clock signal is input to the second NMOS transistor; and at least one of a first wiring configured to connect a source of the first PMOS transistor and a source of the first NMOS transistor and a second wiring configured to connect a source of the second PMOS transistor and a source of the second NMOS transistor.

According to one embodiment of the present disclosure, a semiconductor integrated circuit device includes the flip-flop circuit.

According to one embodiment of the present disclosure, a vehicle includes the semiconductor integrated circuit device.

DETAILED DESCRIPTION

In the present disclosure, a MOS transistor refers to a transistor whose gate structure consists of at least three layers of "a layer formed of a conductor or a semiconductor such as polysilicon having a small resistance value," an "insulating layer," and a "P-type, N-type, or intrinsic semiconductor layer." That is, the gate structure of the MOS transistor is not limited to the three-layer structure of metal, oxide, and semiconductor.

<General Flip-Flop Circuit>

Figure 1:
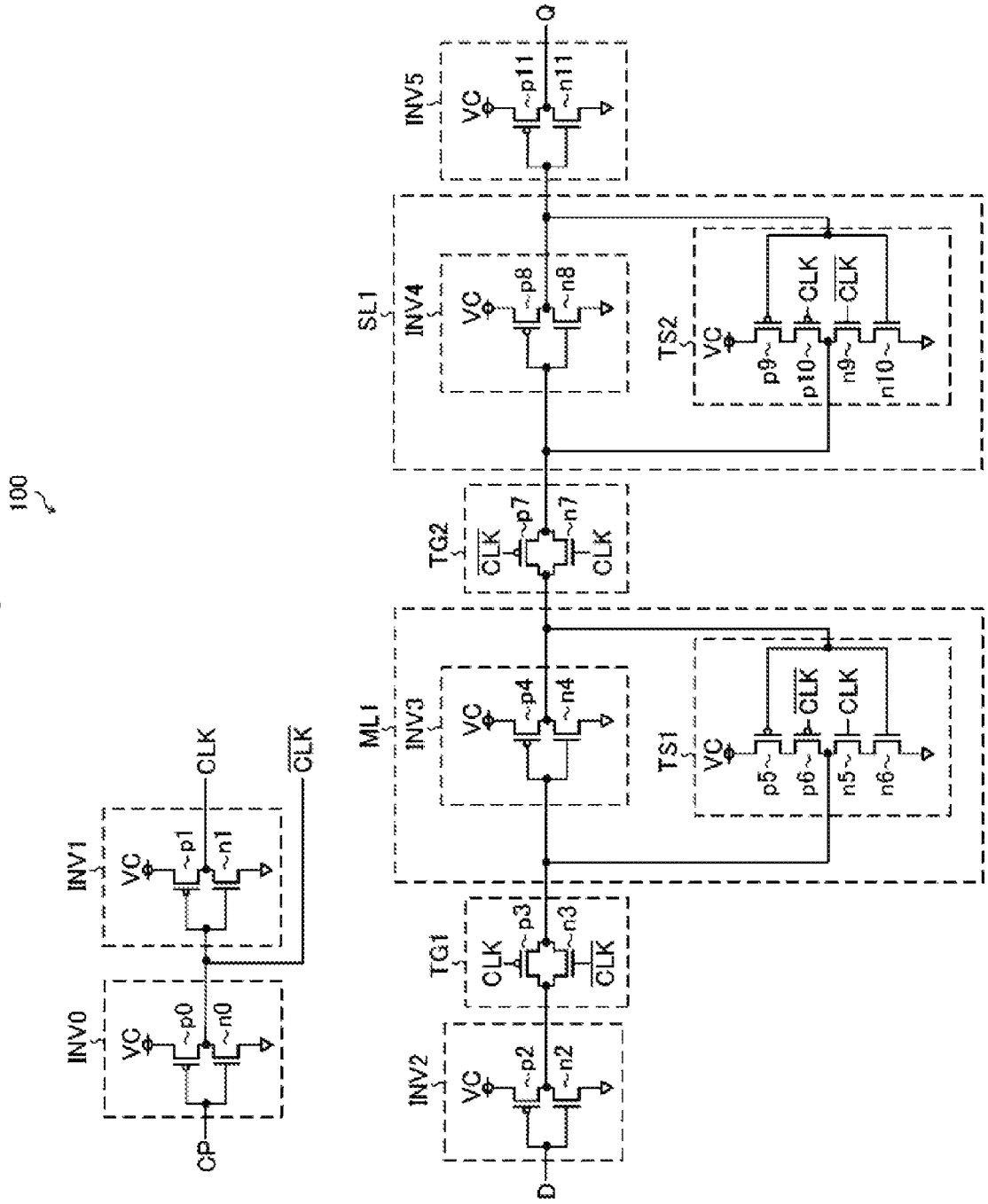
FIG. 1 is a diagram showing a configuration example of a general flip-flop circuit.

Prior to describing embodiments of the present disclosure, a general flip-flop circuit will be described. FIG. 1 is a diagram showing a configuration example of the general flip-flop circuit.

The general flip-flop circuit 100 (hereinafter referred to as a "flip-flop circuit 100") shown in FIG. 1 is a D-type flip-flop circuit. The flip-flop circuit 100 includes inverters INV0, INV1, INV2, and INV5, transmission gates TG1 and TG2, a master latch ML1, and a slave latch SL1.

The inverters INV0 and INV1 are connected in series in two stages to generate a clock signal CLK and an inverted clock signal $\overline{CLK}$, which is an inversion of the clock signal CLK, from an input clock signal CP. The inverter INV0 includes a PMOS transistor p0 and an NMOS transistor n0 which are sequentially connected in series from a power supply potential VC side to a reference potential side. The inverter INV1 includes a PMOS transistor p1 and an NMOS transistor n1 which are sequentially connected in series from the power supply potential VC side to the reference potential side. The reference potential is lower than the power supply potential VC.

The inverter INV2 generates an inversion of a data signal D from the data signal D. The inverter INV2 includes a PMOS transistor p2 and an NMOS transistor n2 which are sequentially connected in series from the power supply potential VC side to the reference potential side.

The inversion of the data signal D is supplied to an input terminal of the transmission gate TG1. An output terminal of the transmission gate TG1 is connected to an input terminal of the master latch ML1.

The transmission gate TG1 is a switch circuit that turns on when the clock signal CLK is at a LOW level and turns off when the clock signal CLK is at a HIGH level. The transmission gate TG1 includes a PMOS transistor p3 and an NMOS transistor n3. One of a source and a drain of the PMOS transistor p3 is the input terminal of the transmission gate TG1, and the other is the output terminal of the transmission gate TG1. One of a source and a drain of the NMOS transistor n3 is the input terminal of the transmission gate TG1, and the other is the output terminal of the transmission gate TGT.

Details of the master latch ML1 will be described later.

An output terminal of the master latch ML1 is connected to an input terminal of the transmission gate TG2. An output terminal of the transmission gate TG2 is connected to an input terminal of the slave latch SL1.

The transmission gate TG2 is a switch circuit that turns on when the clock signal CLK is at the HIGH level and turns off when the clock signal CLK is at the LOW level. The transmission gate TG2 includes a PMOS transistor p7 and an NMOS transistor n7. One of a source and a drain of the PMOS transistor p7 is the input terminal of the transmission gate TG2, and the other is the output terminal of the transmission gate TG2. One of a source and a drain of the NMOS transistor n7 is the input terminal of the transmission gate TG2, and the other is the output terminal of the transmission gate TG2.

Details of the slave latch SL1 will be described later.

The inverter INV5 outputs a signal Q which is an inversion of an output signal of the slave latch SL1. The inverter INV5 includes a PMOS transistor p11 and an NMOS transistor n11 which are sequentially connected in series from the power supply potential VC side to the reference potential side.

The master latch ML1 includes an inverter INV3 and a tri-state inverter TS1. The master latch ML1 maintains (or holds) a signal input to the master latch ML1.

An input terminal of the inverter INV3 and an output terminal of the tri-state inverter TS1 are the input terminal of the master latch ML1. An output terminal of the inverter INV3 and an input terminal of the tri-state inverter TS1 are the output terminal of the master latch ML1.

The inverter INV3 includes a PMOS transistor p4 and an NMOS transistor n4 which are sequentially connected in series from the power supply potential VC side to the reference potential side.

The tri-state inverter TS1 outputs a signal, which is an inversion of an output signal of the inverter INV3, when the clock signal CLK is at the HIGH level, and is in a high impedance state when the clock signal CLK is at the LOW level. The tri-state inverter TS1 includes a PMOS transistor p5, a PMOS transistor p6, an NMOS transistor n5, and an NMOS transistor n6 which are sequentially connected in series from the power supply potential VC side to the reference potential side. The output signal of the inverter INV3 is supplied to each of gates of the PMOS transistor p5 and the NMOS transistor n6, the inverted clock signal $\overline{CLK}$ is supplied to a gate of the PMOS transistor p6, and the clock signal CLK is supplied to a gate of the NMOS transistor n5.

The slave latch SL1 includes an inverter INV4 and a tri-state inverter TS2. The slave latch SL1 maintains (or holds) a signal input to the slave latch SL1.

An input terminal of the inverter INV4 and an output terminal of the tri-state inverter TS2 are the input terminal of the slave latch SL1. An output terminal of the inverter INV4 and an input terminal of the tri-state inverter TS2 are the output terminal of the slave latch SL1.

The inverter INV4 includes a PMOS transistor p8 and an NMOS transistor n8 which are sequentially connected in series from the power supply potential VC side to the reference potential side.

The tri-state inverter TS2 outputs a signal, which is an inversion of an output signal of the inverter INV4, when the clock signal CLK is at the LOW level, and is in a high impedance state when the clock signal CLK is at the HIGH level. The tri-state inverter TS2 includes a PMOS transistor p9, a PMOS transistor p10, an NMOS transistor n9, and an NMOS transistor n10 which are sequentially connected in series from the power supply potential VC side to the reference potential side. An output signal of the inverter INV4 is supplied to each of gates of the PMOS transistor p9 and the NMOS transistor n10, the clock signal CLK is supplied to a gate of the PMOS transistor p10, and the inverted clock signal $\overline{CLK}$ is supplied to a gate of the NMOS transistor n9.

<Flip-Flop Circuit According to First Embodiment>

Figure 2:
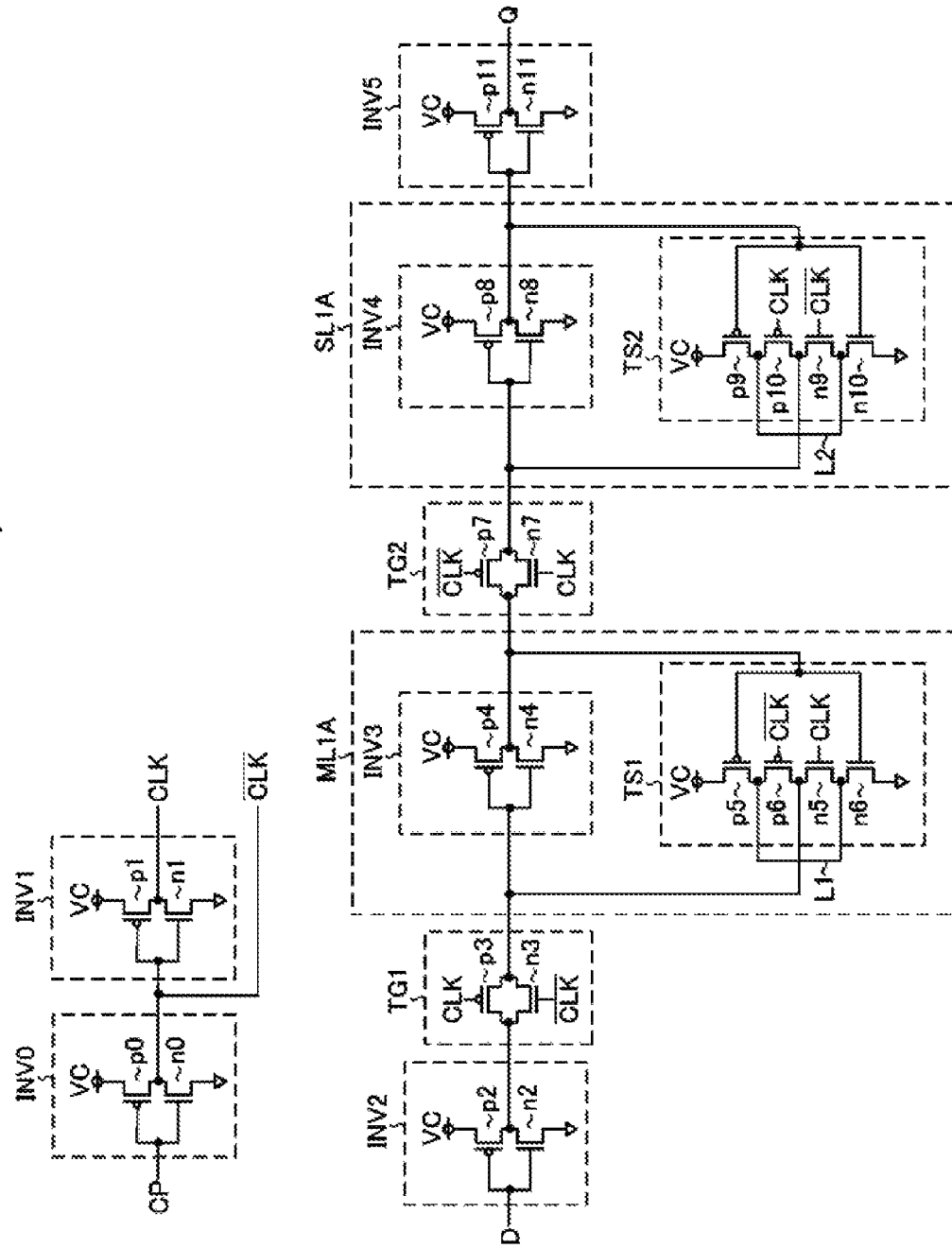
FIG. 2 is a diagram showing the configuration of a flip-flop circuit according to a first embodiment.

FIG. 2 is a diagram showing a configuration example of a flip-flop circuit according to a first embodiment.

The flip-flop circuit 101 according to the first embodiment shown in FIG. 2 (hereinafter referred to as a "flip-flop circuit 101") is a D-type flip-flop circuit. The flip-flop circuit 101 has a configuration in which the master latch ML1 in the flip-flop circuit 100 is replaced with a master latch ML1A and the slave latch SL1 in the flip-flop circuit 100 is replaced with a slave latch SL1A.

The master latch ML1A has a configuration in which a wiring L1 is added to the tri-state inverter TS1 in the master latch ML1. The wiring L1 is configured to connect a source of the PMOS transistor p6 and a source of the NMOS transistor n5. By adding the wiring L1 to the tri-state inverter TS1 which is vulnerable to radiation, the source of the PMOS transistor p6 and the source of the NMOS transistor n5 are connected in parallel, so that the amount of current flowing out to an output of the tri-state inverter TS1 increases. That is, the addition of the wiring L1 improves a driving force of the tri-state inverter TS1. By improving the driving force of the tri-state inverter TS1, the vulnerability of the tri-state inverter TS1 to radiation can be improved, and the influence of radiation on the master latch ML1A can be suppressed.

The slave latch SL1A has a configuration in which a wiring L2 is added to the tri-state inverter TS2 in the slave latch SL1. The wiring L2 is configured to connect a source of the PMOS transistor p10 and a source of the NMOS transistor n9. By adding the wiring L2 to the tri-state inverter TS2 which is vulnerable to radiation, the source of the PMOS transistor p10 and the source of the NMOS transistor n9 are connected in parallel, so that the amount of current flowing out to an output of the tri-state inverter TS2 increases. That is, the addition of the wiring L2 improves a driving force of the tri-state inverter TS2. By improving the driving force of the tri-state inverter TS2, the vulnerability of the tri-state inverter TS2 to radiation can be improved, and the influence of radiation on the slave latch SL1A can be suppressed.

According to a circuit simulation, it has been confirmed that a critical charge amount $Q_{crit}$ at each of output points of the tri-state inverters TS1 and TS2 of the flip-flop circuit 101 is larger than the critical charge amount $Q_{crit}$ at each of output points of the tri-state inverters TS1 and TS2 of the flip-flop circuit 100. That is, it has been confirmed from the circuit simulation that the addition of the wirings L1 and L2 improves the vulnerability of the tri-state inverters TS1 and TS2 to radiation.

Further, since the flip-flop circuit 101 has a configuration in which the wirings L1 and L2 are added to the flip-flop circuit 100, overheads of circuit area, delay time, and power consumption can be suppressed as compared with a redundant flip-flop circuit.

The flip-flop circuit 101 has a configuration in which both the wirings L1 and L2 are added to the flip-flop circuit 100, but the flip-flop circuit 101 may have a configuration in which one of the wirings L1 and L2 is added to the flip-flop circuit 100. It is considered that the soft error resistance can be improved as compared with the flip-flop circuit 100 even if one of the wirings L1 and L2 is added.

<Flip-Flop Circuit According to Second Embodiment>

Figure 3A:
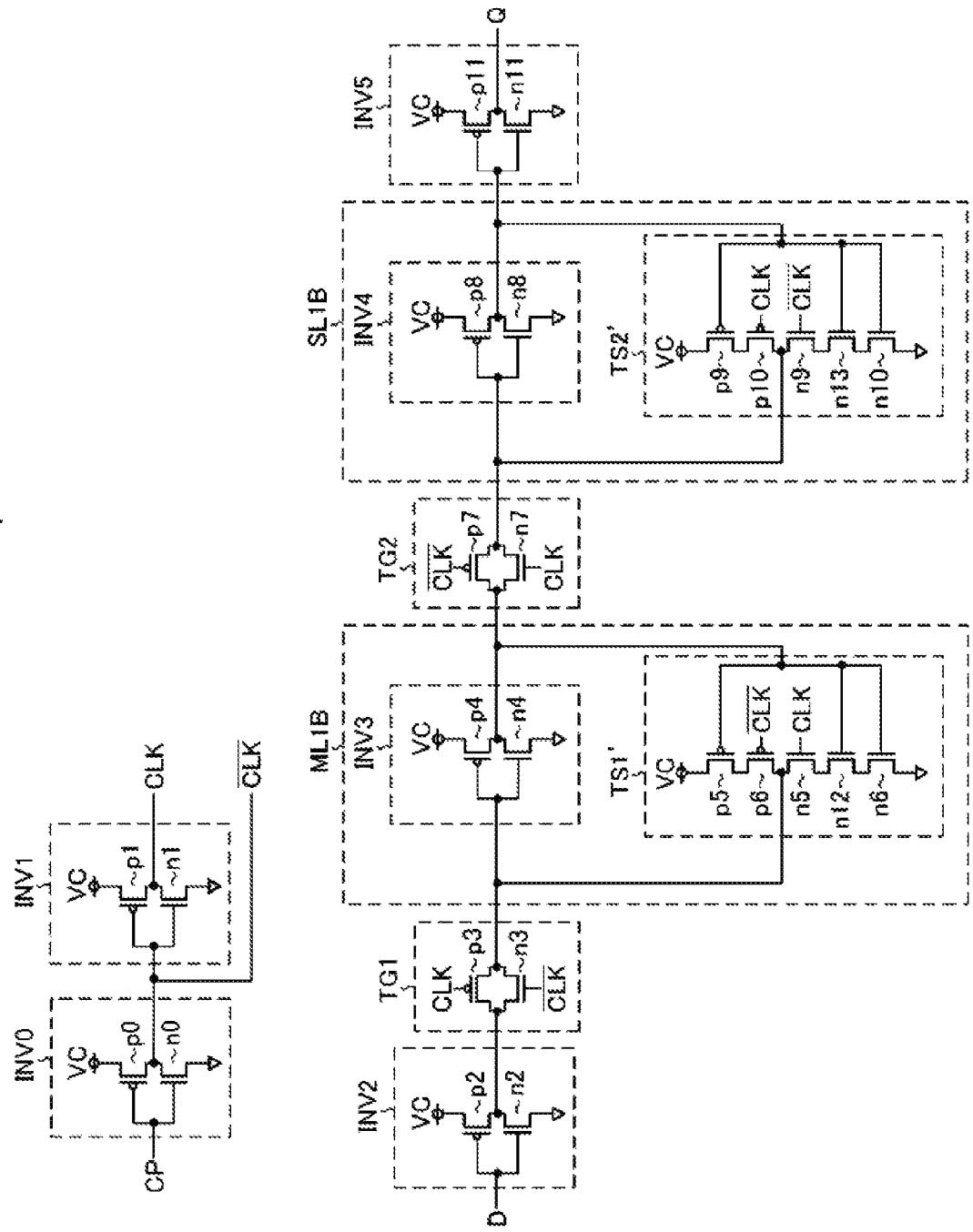
FIG. 3A is a diagram showing the configuration of a flip-flop circuit according to a second embodiment.

FIG. 3A is a diagram showing a configuration example of a flip-flop circuit according to a second embodiment.

The flip-flop circuit 102 according to the second embodiment shown in FIG. 3A (hereinafter referred to as a "flip-flop circuit 102") is a D-type flip-flop circuit. The flip-flop circuit 102 has a configuration in which the master latch ML1 in the flip-flop circuit 100 is replaced with a master latch ML1B and the slave latch SL1 in the flip-flop circuit 100 is replaced with a slave latch SL1B.

The master latch ML1B has a configuration in which the tri-state inverter TS1 in the master latch ML1 is replaced with a tri-state inverter TS1'. The slave latch SL1B has a configuration in which the tri-state inverter TS2 in the slave latch SL1 is replaced with a tri-state inverter TS2'.

The tri-state inverter TS1' has a configuration in which an NMOS transistor n12 is added to the tri-state inverter TS1. The NMOS transistor n12 is provided between the NMOS transistor n5 and the NMOS transistor n6. An output signal of the inverter INV3 is supplied to a gate of the NMOS transistor n12.

The tri-state inverter TS2' has a configuration in which an NMOS transistor n13 is added to the tri-state inverter TS2. The NMOS transistor n13 is provided between the NMOS transistor n9 and the NMOS transistor n10. An output signal of the inverter INV4 is supplied to a gate of the NMOS transistor n13.

Figure 3B:
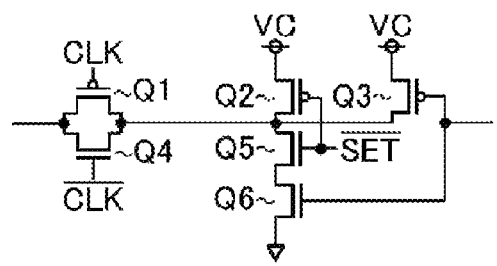
FIG. 3B is a diagram showing a configuration example of a circuit having a structure with a set.

Alpha ray irradiation tests have shown that a circuit having a structure with a set or with a reset are more resistant to a soft error than a circuit having a structure without a set and a reset. An example of the circuit having a structure with a set or a reset may include a circuit having a structure with a set shown in FIG. 3B. The circuit shown in FIG. 3B includes PMOS transistors Q1 to Q3 and NMOS transistors Q4 to Q6. In the circuit shown in FIG. 3B, when an inverted set signal $\overline{SET}$, which is an inversion of a set signal SET, is at a LOW level, the PMOS transistor Q2 is turned on and the NMOS transistor Q5 is turned off.

Therefore, the flip-flop circuit 102 adopts the series connection of the NMOS transistors existing in the circuit having the structure with the set or the reset to improve the soft error resistance.

By providing the NMOS transistor n12 between the NMOS transistor n5 and the NMOS transistor n6, it is possible to prevent an output point of the tri-state inverter TS1' from being directly conducted to the reference potential due to the parasitic bipolar effect. Therefore, it is considered that a soft error due to the parasitic bipolar effect can be suppressed by providing the NMOS transistor n12 between the NMOS transistor n5 and the NMOS transistor n6. Further, by providing the NMOS transistor n13 between the NMOS transistor n9 and the NMOS transistor n10, it is possible to prevent an output point of the tri-state inverter TS2' from being directly conducted to the reference potential due to the parasitic bipolar effect. Therefore, it is considered that a soft error due to the parasitic bipolar effect can be suppressed by providing the NMOS transistor n13 between the NMOS transistor n9 and the NMOS transistor n10.

Further, since the flip-flop circuit 102 has a configuration in which the NMOS transistors n12 and n13 are added to the flip-flop circuit 100, the overheads of circuit area, delay time, and power consumption are suppressed as compared with a redundant flip-flop circuit.

The flip-flop circuit 102 has a configuration in which both the NMOS transistors n12 and n13 are added to the flip-flop circuit 100, but the flip-flop circuit 102 may have a configuration in which one of the NMOS transistors n12 and n13 is added. It is considered that the soft error resistance can be improved as compared with the flip-flop circuit 100 even if one of the NMOS transistors n12 and n13 is added.

<Flip-Flop Circuit According to Third Embodiment>

Figure 4:
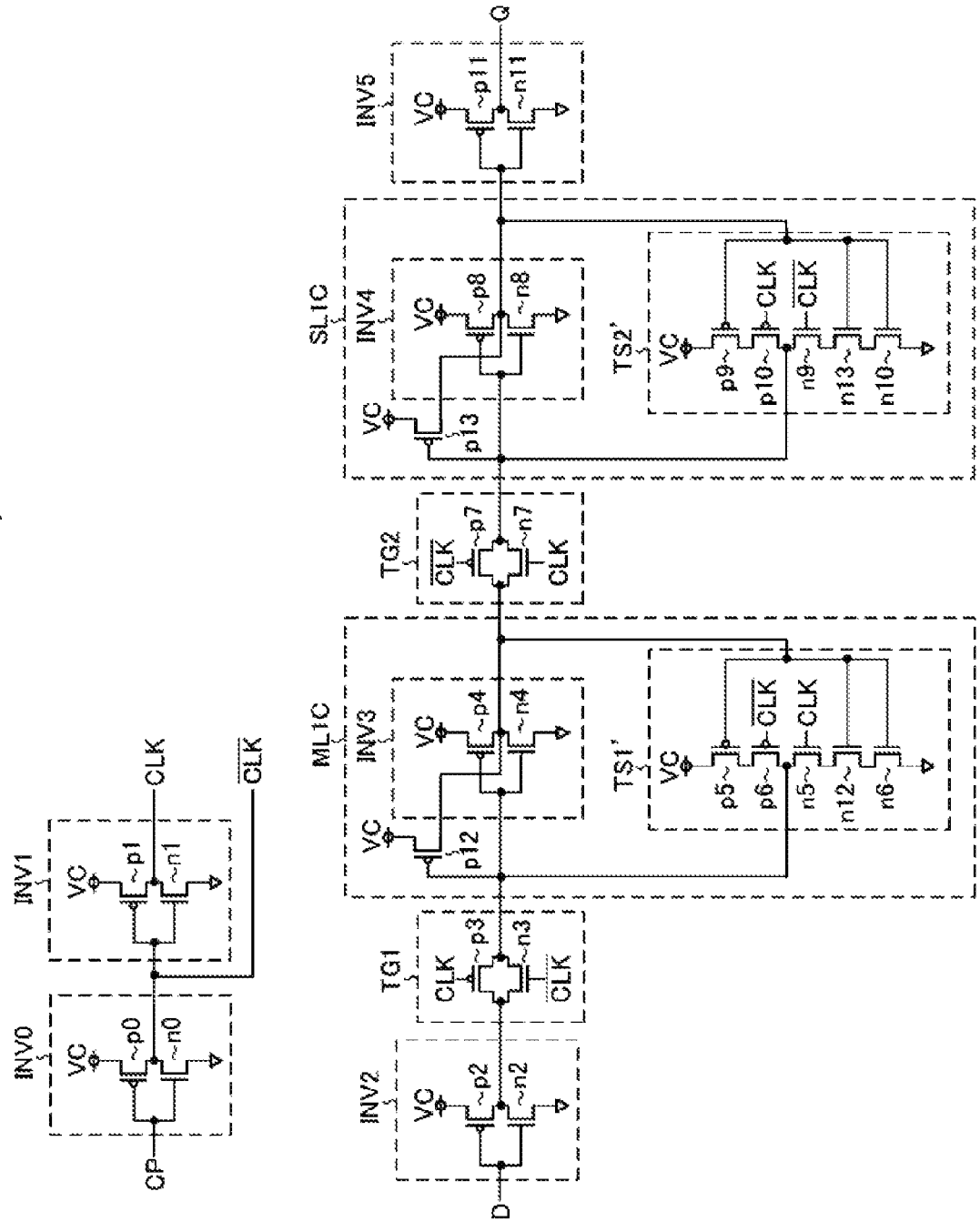
FIG. 4 is a diagram showing the configuration of a flip-flop circuit according to a third embodiment.

FIG. 4 is a diagram showing a configuration example of a flip-flop circuit according to a third embodiment.

The flip-flop circuit 103 according to the third embodiment shown in FIG. 4 (hereinafter referred to as a "flip-flop circuit 103") is a D-type flip-flop circuit. The flip-flop circuit 103 has a configuration in which the master latch ML1B in the flip-flop circuit 102 is replaced with a master latch ML1C and the slave latch SL1B in the flip-flop circuit 102 is replaced with a slave latch SL1C.

The master latch ML1C has a configuration in which a PMOS transistor p12 is added to the master latch ML1B. The slave latch SL1C has a configuration in which a PMOS transistor p13 is added to the slave latch SL1B.

The PMOS transistor p12 is connected in parallel to the PMOS transistor p4. The gate of the PMOS transistor p12 is connected to the output terminal of the ti-state inverter TS1'. The PMOS transistor p13 is connected in parallel to the PMOS transistor p8. The gate of the PMOS transistor p13 is connected to the output terminal of the tri-state inverter TS2'.

By adding the PMOS transistor p12, the amount of current flowing into an output point of the master latch ML1C is larger than the amount of current flowing into an output point of the master latch ML1B. Further, by adding the PMOS transistor p13, the amount of current flowing into an output point of the slave latch SL1C is larger than the amount of current flowing into an output point of the slave latch SL1B. As a result, the soft error resistance of the flip-flop circuit 103 is improved as compared with the soft error resistance of the flip-flop circuit 102.

<Flip-Flop Circuit According to Fourth Embodiment>

Figure 5:
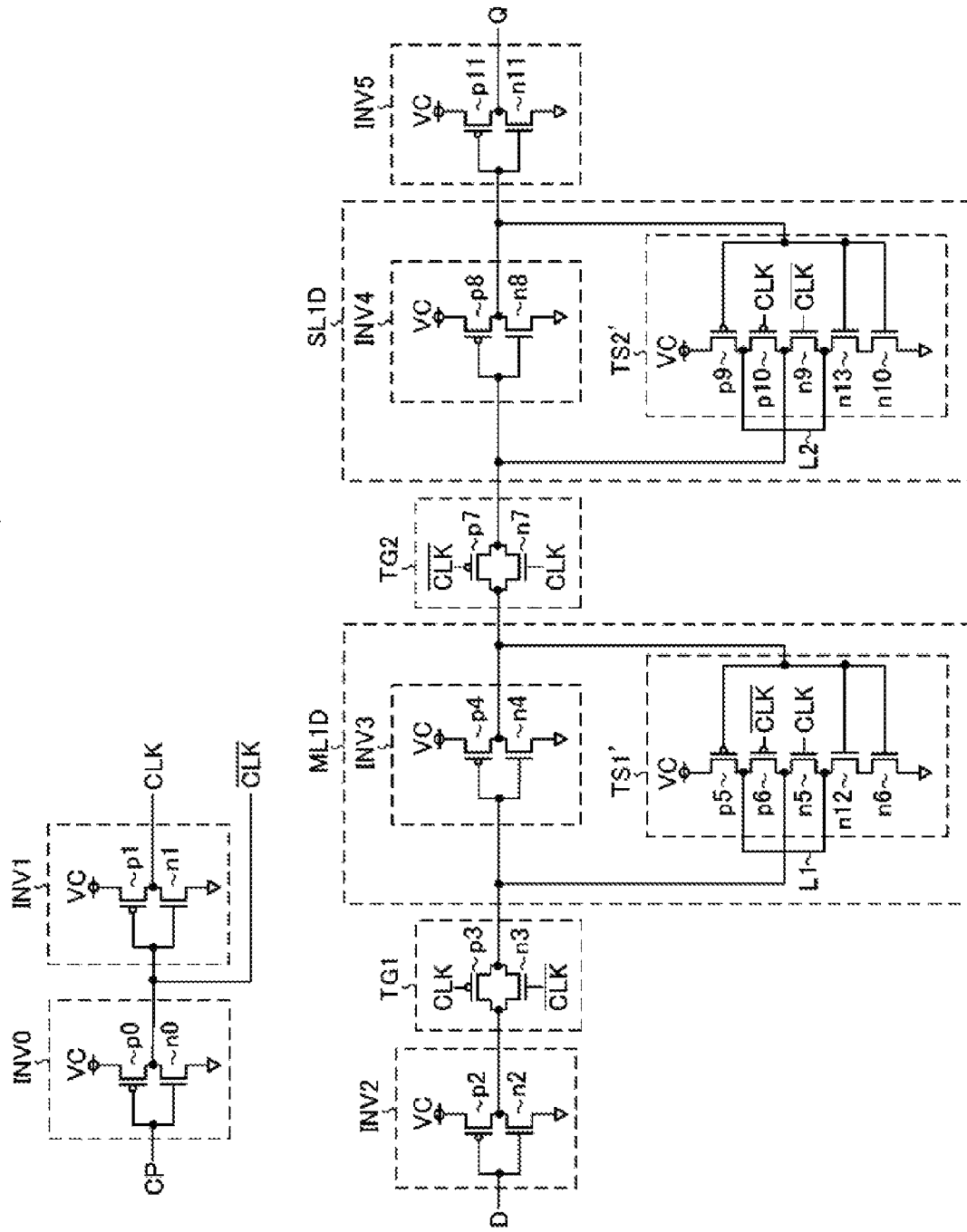
FIG. 5 is a diagram showing the configuration of a flip-flop circuit according to a fourth embodiment.

FIG. 5 is a diagram showing a configuration example of a flip-flop circuit according to a fourth embodiment.

The flip-flop circuit 104 according to the fourth embodiment shown in FIG. 5 (hereinafter referred to as a "flip-flop circuit 104") is a D-type flip-flop circuit. The flip-flop circuit 104 has a configuration in which the master latch ML1 in the flip-flop circuit 100 is replaced with a master latch ML1D and the slave latch SL1 in the flip-flop circuit 100 is replaced with a slave latch SL1D.

The master latch ML1D has a configuration in which the master latch ML1A of the first embodiment and the master latch ML1B of the second embodiment are combined.

The slave latch SL1D has a configuration in which the slave latch SL1A of the first embodiment and the slave latch SL1B of the second embodiment are combined.

The flip-flop circuit 104 is designed to further improve the soft error resistance as compared with the flip-flop circuit 101.

<Flip-Flop Circuit According to Fifth Embodiment>

Figure 6:
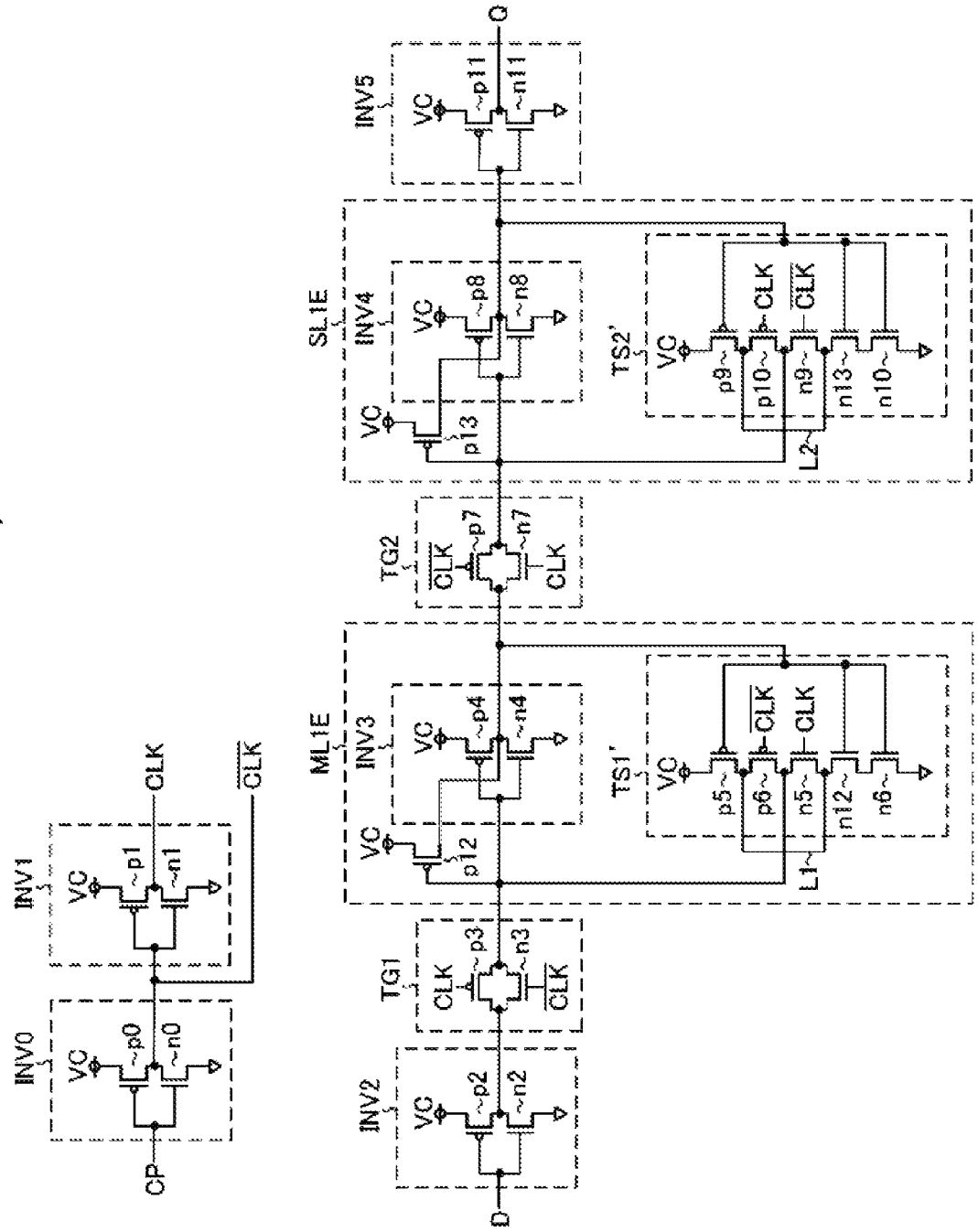
FIG. 6 is a diagram showing the configuration of a flip-flop circuit according to a fifth embodiment.

FIG. 6 is a diagram showing a configuration example of a flip-flop circuit according to a fifth embodiment.

The flip-flop circuit 105 according to the fifth embodiment shown in FIG. 6 (hereinafter referred to as a "flip-flop circuit 105") is a D-type flip-flop circuit. The flip-flop circuit 105 has a configuration in which the master latch ML1 in the flip-flop circuit 100 is replaced with a master latch ML1E and the slave latch SL1 in the flip-flop circuit 100 is replaced with a slave latch SL1E.

The master latch ML1E has a configuration in which the master latch ML1A of the first embodiment and the master latch ML1C of the third embodiment are combined.

The slave latch SL1E has a configuration in which the slave latch SL1A of the first embodiment and the slave latch SL1C of the third embodiment are combined.

The flip-flop circuit 105 is designed to further improve the soft error resistance as compared with the flip-flop circuit 101.

<Switching Power Supply Device and Vehicle>

Figure 7:
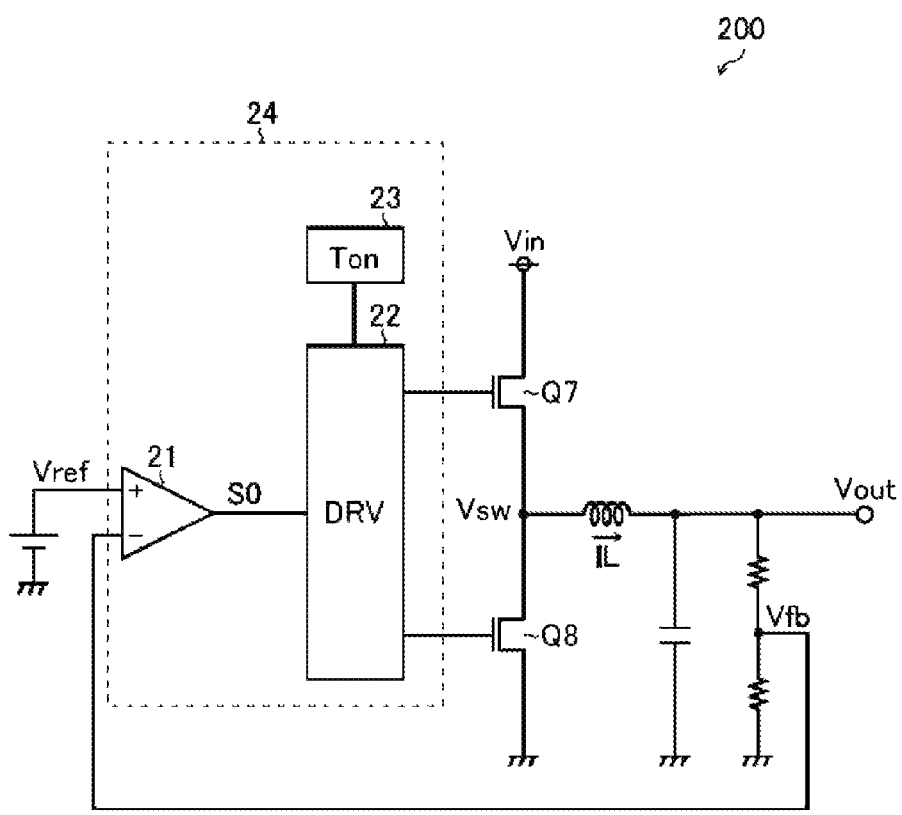
FIG. 7 is a diagram showing the schematic configuration of a switching power supply device.

The above-described flip-flop circuits can be used, for example, in a switching power supply device shown in FIG. 7. The switching power supply device shown in FIG. 7 is a step-down DC/DC converter with a bottom detection on-time fix system that steps down an input voltage Vin to generate a desired output voltage Vout.

When the switching power supply device 200 shown in FIG. 7 detects that a feedback voltage Vfb drops to a reference voltage Vref, a driver 22 turns on an upper transistor Q7 so that a switch voltage Vsw has a high level by a predetermined on-time Ton, based on output from an on-time setting circuit 23 that sets the predetermined on-time Ton. The driver 22 turns off the upper transistor Q7 except for the predetermined on-time Ton. Further, the upper transistor Q7 and a lower transistor Q8 are complementarily switched by the driver 22.

Further, in the switching power supply device 200 shown in FIG. 7, the driver 22 executes an operation according to an output of a current sensor, a temperature sensor, or the like in order to realize an overcurrent protection function, an overheat protection function, or the like.

The driver 22 is a power supply control circuit that controls a state of a bottom detection on-time fix system switching power supply device, and the driver 22 includes the above-described flip-flop circuits. A comparator 21 for comparing the feedback voltage Vfb and the reference voltage Vref, the driver 22, and the on-time setting circuit 23 are provided in a semiconductor integrated circuit device 24.

The above-described flip-flop circuits can also be used for a switching power supply device other than the bottom detection on-time fix system. Further, the above-described flip-flop circuits can be used not only for a switching power supply device but also for, for example, a motor drive device.

Figure 8:
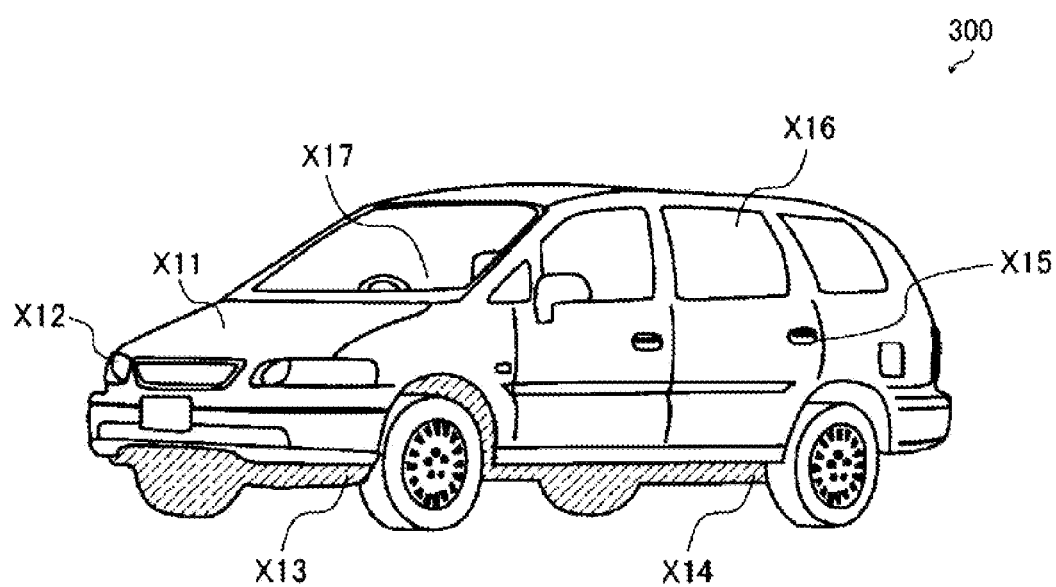
FIG. 8 is an external view of a vehicle.

Next, an application example of the above-described switching power supply device 200 will be described. FIG. 8 is an external view showing a configuration example of a vehicle equipped with in-vehicle apparatuses. The vehicle 300 of this configuration example is equipped with in-vehicle apparatuses X11 to X17 and a battery (not shown) for supplying electric power to these in-vehicle apparatuses X11 to X17.

The in-vehicle apparatus X11 is an electronic controller that performs engine-related control (injection control, electronic throttle control, idling control, oxygen sensor heater control, auto-cruise control, etc.).

The in-vehicle apparatus X12 is a lamp controller that performs lighting-on/off control of HID [High Intensity Discharged Lamp], DRL [Daytime Running Lamp], etc.

The in-vehicle apparatus X13 is a transmission controller that performs transmission-related control.

The in-vehicle apparatus X14 is a body controller that performs control related to the motion of the vehicle X (ABS [Anti-lock Brake System] control, EPS [Electric Power Steering] control, electronic suspension control, etc.).

The in-vehicle apparatus X15 is a security controller that performs drive control of a door lock, a security alarm, etc.

The in-vehicle apparatus X16 is an electronic apparatus incorporated in the vehicle X at the factory shipment stage, as standard equipment or manufacturer's options such as a wiper, an electric door mirror, a power window, an electric sunroof, an electric seat, an air conditioner, etc.

The in-vehicle apparatus X17 is an electronic apparatus that is mounted on the vehicle X, as user's options such as an in-vehicle A/V [Audio/Visual] apparatus, a car navigation system, an ETC [Electronic Toll Collection] system, etc.

The above-described switching power supply device 200 can be incorporated into any of the in-vehicle apparatuses X11 to X17.

<Others>

In addition to the above-described embodiments, the configuration of the present disclosure can be modified in various ways without departing from the gist of the disclosure. It should be considered that the embodiments are exemplary in all respects and are not restrictive, and the technical scope of the present disclosure is defined by the claims rather than the description of the embodiments and should be understood to include all changes that fall within the meaning and scope equivalent to the claims.

By increasing the gate width of the MOS transistor, the soft error resistance of the flip-flop circuit can be improved. However, if the gate widths of all MOS transistors are increased, the efficiency of improvement of the soft error resistance with respect to the size of the circuit area is not good.

Among electron-hole pairs generated by radiation passing through or colliding with a semiconductor integrated circuit device, many electrons with high mobility are collected in an NMOS transistor. Therefore, a soft error is likely to occur when the NMOS transistor is turned off. Therefore, soft error resistance can be improved by increasing a current that flows when a PMOS transistor that is paired with the NMOS transistor is turned on, so that the electrons collected in the NMOS transistor can be quickly removed.

Therefore, it is possible to efficiently improve the soft error resistance by making the gate width of a PMOS transistor included in a tri-state inverter in a master latch larger than the gate width of an NMOS transistor included in the tri-state inverter in the master latch. Similarly, it is possible to efficiently improve the soft error resistance by making the gate width of a PMOS transistor included in a tri-state inverter in a slave latch larger than the gate width of an NMOS transistor included in the tri-state inverter in the slave latch.

A flip-flop circuit (101, 104, 105) according to the above-described one aspect has a configuration (first configuration) that includes: a master latch (ML1A, ML1D, ML1E) including a first inverter (INV3) and a first tri-state inverter (TS1, TS1') configured such that an input terminal of the first tri-state inverter is connected to an output terminal of the first inverter and an output terminal of the first tri-state inverter is connected to an input terminal of the first inverter, wherein the first tri-state inverter includes a first NMOS transistor (n5) configured such that a clock signal is input to a gate of the first NMOS transistor, and a first PMOS transistor (p6) configured such that an inverted clock signal, which is an inversion of the clock signal, is input to the first PMOS transistor; a slave latch (SL1A, SL1D, SL1E) including a second inverter (INV4) and a second tri-state inverter (TS2, TS2') configured such that an input terminal of the second tri-state inverter is connected to an output terminal of the second inverter and an output terminal of the second tri-state inverter is connected to an input terminal of the second inverter, wherein the second tri-state inverter includes a second PMOS transistor (p10) configured such that the clock signal is input to a gate of the second PMOS transistor, and a second NMOS transistor (n9) configured such that the inverted clock signal is input to the second NMOS transistor; and at least one of a first wiring (L1) configured to connect a source of the first PMOS transistor and a source of the first NMOS transistor and a second wiring (L2) configured to connect a source of the second PMOS transistor and a source of the second NMOS transistor.

The flip-flop circuit having the first configuration can improve soft error resistance while suppressing the overheads of circuit area, delay time, and power consumption.

The flip-flop circuit of the first configuration may have a configuration (second configuration) that the first tri-state inverter includes two NMOS transistors (n6, n12) directly connected to each other and configured such that output of the first inverter is input to gates of the two NMOS transistors.

The flip-flop circuit having the second configuration can further improve the soft error resistance as compared with the flip-flop circuit having the first configuration.

The flip-flop circuit of the second configuration may have a configuration (third configuration) that further includes: a PMOS transistor (p12) connected in parallel to the PMOS transistor (p4) included in the first inverter and configured such that the output terminal of the first tri-state inverter is connected to a gate of the connected PMOS transistor.

The flip-flop circuit having the third configuration can further improve the soft error resistance as compared with the flip-flop circuit having the second configuration.

The flip-flop circuit of any one of the first to third configurations may have a configuration (fourth configuration) that the second ti-state inverter includes two NMOS transistors (n10, n13) directly connected to each other and configured such that output of the second inverter is input to gates of the two NMOS transistors.

The flip-flop circuit having the fourth configuration can further improve the soft error resistance as compared with the flip-flop circuit having the first configuration.

The flip-flop circuit of the fourth configuration may have a configuration (fifth configuration) that further includes: a PMOS transistor (p13) connected in parallel to the PMOS transistor (p8) included in the second inverter and configured such that the output terminal of the second tri-state inverter is connected to a gate of the PMOS transistor.

The flip-flop circuit having the fifth configuration can further improve the soft error resistance as compared with the flip-flop circuit having the fourth configuration.

A flip-flop circuit (102, 103) according to the above-described one aspect has a configuration (sixth configuration) that includes: a master latch (ML1B, ML1C) including a first inverter (INV3) and a first tri-state inverter (TS1') configured such that an input terminal of the first tri-state inverter is connected to an output terminal of the first inverter and an output terminal of the first tri-state inverter is connected to an input terminal of the first inverter, wherein the first tri-state inverter includes a first NMOS transistor (n5) configured such that a clock signal is input to a gate of the first NMOS transistor, and a first PMOS transistor (p6) configured such that an inverted clock signal, which is an inversion of the clock signal, is input to the first PMOS transistor; and a slave latch (SL1B, SL1C) including a second inverter (INV4) and a second tri-state inverter (TS2') configured such that an input terminal of the second tri-state inverter is connected to an output terminal of the second inverter and an output terminal of the second tri-state inverter is connected to an input terminal of the second inverter, wherein the second tri-state inverter includes a second PMOS transistor (p10) configured such that the clock signal is input to a gate of the second PMOS transistor, and a second NMOS transistor (n9) configured such that the inverted clock signal is input to the second NMOS transistor, wherein the first tri-state inverter includes two NMOS transistors (n6, n12) directly connected to each other and configured such that output of the first inverter is input to gates of the two NMOS transistors.

The flip-flop circuit having the sixth configuration can improve soft error resistance while suppressing the overheads of circuit area, delay time, and power consumption.

A semiconductor integrated circuit device (24) has a configuration (seventh configuration) that includes a flip-flop circuit of any one of the first to sixth configurations.

The semiconductor integrated circuit device having the seventh configuration can improve soft error resistance of the flip-flop circuit while suppressing the overheads of circuit area, delay time, and power consumption of the flip-flop circuit.

A vehicle (300) has a configuration (eighth configuration) that includes a semiconductor integrated circuit device of the seventh configuration.

The vehicle having the eighth configuration can improve soft error resistance of the flip-flop circuit while suppressing the overheads of circuit area, delay time, and power consumption of the flip-flop circuit.

According to the flip-flop circuit, the semiconductor integrated circuit device, and the vehicle disclosed in the present disclosure, it is possible to improve soft error resistance while suppressing the overheads of circuit area, delay time, and power consumption.

While certain embodiments have been described, these embodiments have been presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A flip-flop circuit comprising:
a master latch including a first inverter and a first tri-state inverter configured such that an input terminal of the first tri-state inverter is connected to an output terminal of the first inverter and an output terminal of the first tri-state inverter is connected to an input terminal of the first inverter, wherein the first tri-state inverter includes a first NMOS transistor configured such that a clock signal is input to a gate of the first NMOS transistor, and a first PMOS transistor configured such that an inverted clock signal, which is an inversion of the clock signal, is input to the first PMOS transistor;
a slave latch including a second inverter and a second tri-state inverter configured such that an input terminal of the second tri-state inverter is connected to an output terminal of the second inverter and an output terminal of the second tri-state inverter is connected to an input terminal of the second inverter, wherein the second tri-state inverter includes a second PMOS transistor configured such that the clock signal is input to a gate of the second PMOS transistor, and a second NMOS transistor configured such that the inverted clock signal is input to the second NMOS transistor; and
at least one of a first wiring configured to connect a source of the first PMOS transistor and a source of the first NMOS transistor and a second wiring configured to connect a source of the second PMOS transistor and a source of the second NMOS transistor,
wherein the first tri-state inverter further includes two NMOS transistors directly connected to each other and configured such that output of the first inverter is input to gates of the two NMOS transistors.

2. The flip-flop circuit of claim 1, further comprising a third PMOS transistor connected in parallel to a PMOS transistor included in the first inverter and configured such that the output terminal of the first tri-state inverter is connected to a gate of the third PMOS transistor.

3. The flip-flop circuit of claim 1, wherein the second tri-state inverter includes two NMOS transistors directly connected to each other and configured such that output of the second inverter is input to gates of the two NMOS transistors.

4. The flip-flop circuit of claim 3, further comprising a fourth PMOS transistor connected in parallel to a PMOS transistor included in the second inverter and configured such that the output terminal of the second tri-state inverter is connected to a gate of the fourth PMOS transistor.

5. A semiconductor integrated circuit device comprising the flip-flop circuit of claim 1.

6. A vehicle comprising the semiconductor integrated circuit device of claim 5.

7. A flip-flop circuit comprising:
a master latch including a first inverter and a first tri-state inverter configured such that an input terminal of the first tri-state inverter is connected to an output terminal of the first inverter and an output terminal of the first tri-state inverter is connected to an input terminal of the first inverter, wherein the first tri-state inverter includes a first NMOS transistor configured such that a clock signal is input to a gate of the first NMOS transistor, and a first PMOS transistor configured such that an inverted clock signal, which is an inversion of the clock signal, is input to the first PMOS transistor; and
a slave latch including a second inverter and a second tri-state inverter configured such that an input terminal of the second tri-state inverter is connected to an output terminal of the second inverter and an output terminal of the second tri-state inverter is connected to an input terminal of the second inverter, wherein the second tri-state inverter includes a second PMOS transistor configured such that the clock signal is input to a gate of the second PMOS transistor, and a second NMOS transistor configured such that the inverted clock signal is input to the second NMOS transistor,
wherein the first tri-state inverter further includes two NMOS transistors directly connected to each other and configured such that output of the first inverter is input to gates of the two NMOS transistors.

* * * * *